(12) United States Patent
Dechene et al.

(10) Patent No.: US 9,670,689 B2
(45) Date of Patent: Jun. 6, 2017

(54) CONTAINER BASED DATA CENTER SOLUTIONS

(75) Inventors: Joseph Dechene, Nashua, NH (US); Lianne M. McMahan, Atkinson, NH (US); William Ziegler, Reading, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 1140 days.

(21) Appl. No.: 12/754,938

(22) Filed: Apr. 6, 2010

(65) Prior Publication Data

US 2011/0240265 A1    Oct. 6, 2011

(51) Int. Cl.
F25D 23/12 (2006.01)
E04H 5/02 (2006.01)
H05K 7/14 (2006.01)
H05K 7/20 (2006.01)
E04H 5/00 (2006.01)

(52) U.S. Cl.
CPC ............. *E04H 5/02* (2013.01); *H05K 7/1497* (2013.01); *H05K 7/20745* (2013.01); *E04H 2005/005* (2013.01)

(58) Field of Classification Search
USPC ............ 62/259.2; 165/104.33; 361/688–727; 454/184
See application file for complete search history.

(56) References Cited

U.S. PATENT DOCUMENTS

| | | | |
|---|---|---|---|
| 6,305,180 B1 * | 10/2001 | Miller et al. | ................. 62/259.2 |
| 7,278,273 B1 | 10/2007 | Whitted et al. | |
| 8,031,468 B2 | 10/2011 | Bean, Jr. et al. | |
| 8,184,435 B2 | 5/2012 | Bean, Jr. et al. | |
| 8,223,495 B1 | 7/2012 | Carlson et al. | |
| 2002/0129566 A1 | 9/2002 | Piccolo et al. | |
| 2006/0082263 A1 | 4/2006 | Rimler et al. | |
| 2006/0172685 A1 | 8/2006 | O'Brien | |
| 2006/0225446 A1 | 10/2006 | Bash et al. | |
| 2006/0260338 A1 | 11/2006 | VanGilder et al. | |
| 2007/0053159 A1 * | 3/2007 | Crippen et al. | ............... 361/695 |
| 2008/0055846 A1 * | 3/2008 | Clidaras et al. | ............... 361/687 |
| 2008/0060372 A1 * | 3/2008 | Hillis et al. | .................. 62/259.2 |
| 2008/0080146 A1 | 4/2008 | King et al. | |

(Continued)

FOREIGN PATENT DOCUMENTS

CA    2751094 A1    8/2010
CN    102334396 A    1/2012

(Continued)

OTHER PUBLICATIONS

International Search Report for PCT/US2011/031351 mailed Mar. 6, 2012.

*Primary Examiner* — Orlando E Aviles Bosques

(74) *Attorney, Agent, or Firm* — Lando & Anastasi, LLP

(57) ABSTRACT

A cooling container comprises a container housing with a chilled water storage tank including a first interface for receiving chilled water. The chilled water tank has a plurality of straight pipes joined by elbows connections to provide a folded path, the full path length being greater than the length of the container housing, and a second interface for outputting the chilled water. A number of interfaces within the container housing are configured to receive a chiller module or a free cool unit.

20 Claims, 13 Drawing Sheets

(56) References Cited

U.S. PATENT DOCUMENTS

| | | |
|---|---|---|
| 2008/0094797 A1 | 4/2008 | Coglitore et al. |
| 2008/0198549 A1* | 8/2008 | Rasmussen et al. .......... 361/696 |
| 2008/0209931 A1* | 9/2008 | Stevens ........................ 62/259.2 |
| 2008/0300725 A1 | 12/2008 | Brey et al. |
| 2009/0241578 A1 | 10/2009 | Carlson et al. |
| 2009/0255653 A1 | 10/2009 | Mills et al. |
| 2009/0294107 A1 | 12/2009 | Nishiyama et al. |
| 2009/0301123 A1 | 12/2009 | Monk et al. |
| 2010/0026094 A1 | 2/2010 | Kraus et al. |
| 2010/0051563 A1 | 3/2010 | Schreiber |
| 2010/0110626 A1 | 5/2010 | Schmitt et al. |
| 2010/0170277 A1* | 7/2010 | Schmitt et al. .............. 62/259.2 |
| 2010/0188816 A1 | 7/2010 | Bean, Jr. et al. |
| 2010/0300650 A1 | 12/2010 | Bean, Jr. |
| 2010/0307716 A1 | 12/2010 | Bean, Jr. et al. |
| 2011/0239679 A1 | 10/2011 | Dechene et al. |
| 2011/0239680 A1 | 10/2011 | Dechene et al. |
| 2011/0239681 A1 | 10/2011 | Ziegler |
| 2011/0240497 A1 | 10/2011 | Dechene et al. |
| 2012/0012283 A1 | 1/2012 | Bean, Jr. et al. |

FOREIGN PATENT DOCUMENTS

| | | |
|---|---|---|
| CN | 102461357 A | 5/2012 |
| EP | 2 101 017 A2 | 9/2009 |
| EP | 2392201 A1 | 12/2011 |
| EP | 2438804 A2 | 4/2012 |
| WO | 00/58673 A1 | 10/2000 |
| WO | 2007139560 A1 | 12/2007 |
| WO | 2009137215 A2 | 11/2009 |
| WO | 2010087915 A1 | 8/2010 |
| WO | 2010141205 A8 | 2/2011 |
| WO | 2011/127125 A8 | 9/2012 |

* cited by examiner

FIG. 2

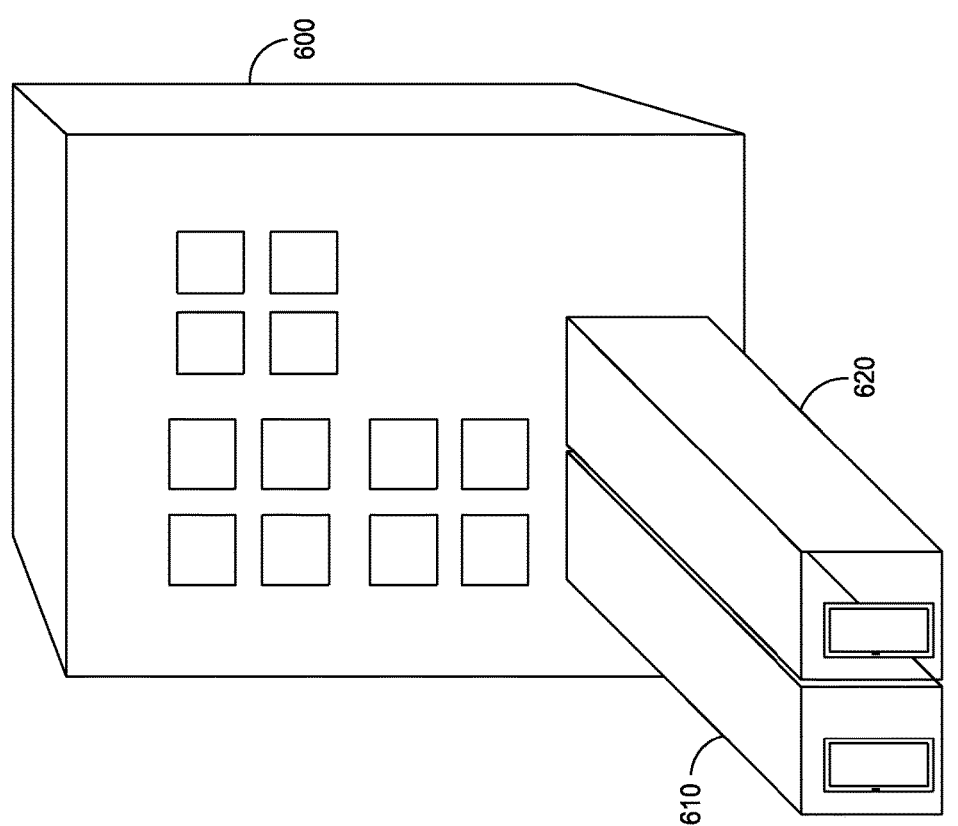

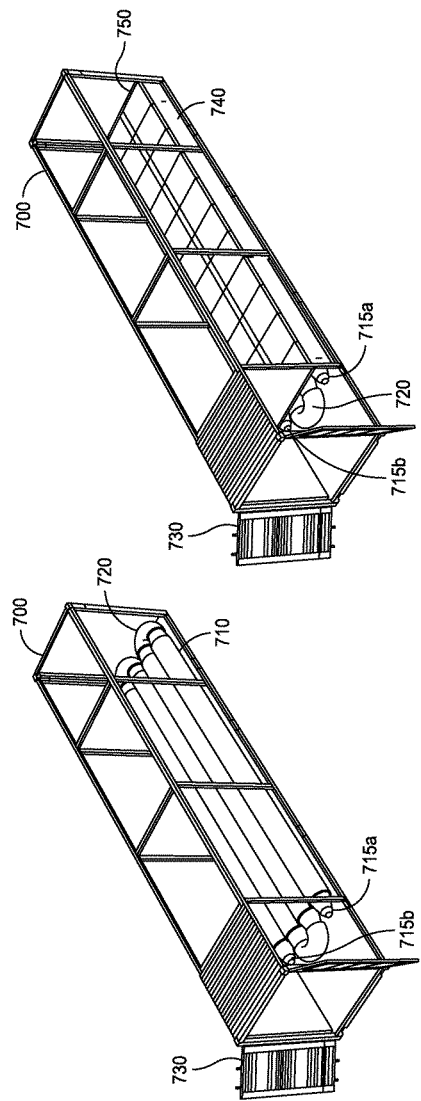

CONTAINER BASED DATA CENTER SOLUTIONS

FIELD OF THE INVENTION

The present invention relates generally to systems and methods for providing containerized data center infrastructure, including power distribution, cooling and equipment mounting facilities for electronic equipment, and more specifically to methods and apparatus for providing containerized data center solutions.

BACKGROUND

Centralized data centers for computer, communications and other electronic equipment have been in use for a number of years, and more recently, with the increasing use of the Internet, large scale data centers that provide hosting services for Internet Service Providers (ISPs), Application Service Providers (ASPs) and Internet content providers are becoming increasingly popular. Typical centralized data centers contain numerous racks of equipment that require power, cooling and connections to communications facilities. It is common in data centers to use raised flooring, beneath which power cables and communication cables may be run between racks of equipment and to facility distribution panels. In addition, it is common to use the space beneath the raised flooring as an air plenum to provide cooling to the racks of equipment. In some facilities, in place of, or in addition to the use of raised flooring, overhead cable ladders are used to route cables throughout the facility. These cable ladders are typically fastened to support members in the ceiling of the facility.

It is often desirable to operate equipment within data centers seven days a week, 24 hours per day, with little or no disruption in service. To prevent any disruption in service, it is common practice in data centers to use uninterruptible power supplies (UPSs) to ensure that the equipment within the data centers receives continuous power throughout any black out or brown out periods. Typically, data centers are equipped with a relatively large UPS at the main power distribution panel for the facility. Often, the UPS is a 480 volt 3 phase unit that is selected to have sufficient capacity to meet the power requirements for all of the equipment within the facility.

SUMMARY

Colocation business centers and large enterprises often have gradually increasing IT needs as their businesses grow. Those IT needs are served by data centers. Regardless of the size of the data center, it takes time to plan and build, often upwards of 18 to 36 months. This planning time ties up a lot of capital as IT, rack, power, and cooling needs to be pre ordered and then painstakingly assembled and tested on site. This long lead time forces the customers to pre-build before the capacity is needed, if ever. Conventional raised floors, CRAC (computer room air conditioning), chiller equipment and plumbing, UPS rooms, distribution rooms may all be pre-built, potentially stranding a lot of capital if this excess capacity is not used.

Embodiments according to principles of the invention include a data center enclosure having a first shipping container for housing data center equipment. The container has a length greater than its width and at least one lengthwise sidewall opening that is configured to connect with another shipping container also having a lengthwise sidewall opening side. The joining of the lengthwise sidewall openings of the two shipping containers creates a single interior space to provide clearance and access. The containers house equipment enclosures, such as equipment racks, where the equipment enclosures are installed in the interior of the containers to form rows perpendicular to the length of the container. The containers further include a utility interface configured to connect at least one data center resource between the first container and a second container. These resources may include a data connection, power, refrigeration fluid, or cooling gases.

In other embodiments, a data center comprises a building containing equipment racks for housing electronic equipment, and a shipping container that houses data center utilities. The container has at least one opening that is configured to connect with the building to provide utilities to the building.

In other embodiments, a data center comprises a data center structure containing equipment racks for housing electronic equipment, an air handling shipping container configured to be vertically mounted to an exterior wall of the structure. The air handling shipping container is configured to draw hot exhaust air from the data center structure and vent cool air into the data center structure. A cooling module container connects with the air handling shipping container and cools the hot exhaust air from the air handling container to provide cool air.

In other embodiments, a data center enclosure includes a shipping container for housing electronic equipment enclosures. The equipment enclosures are installed in the interior of the container to form a row along the length of the container and configured to allow gas to pass through the enclosures from a first region to cool electronic equipment and allow electronic equipment to expel heated gas to a second region. In addition, an exhaust opening in the container in the second region allows heated gas to vent to the heated gas to the atmosphere. The enclosure includes a cooling module that is configured to mount to the container and provide draw gas from the atmosphere, cool the gas, and supply the cool gas to the first region.

In other embodiments, a cooling container comprises a container housing with a chilled water storage tank including a first interface for receiving chilled water. The chilled water tank has a plurality of straight pipes joined by elbows connections to provide a folded path, the full path length being greater than the length of the container housing, and a second interface for outputting the chilled water. A number of interfaces within the container housing are configured to receive a chiller module or a free cool unit.

BRIEF DESCRIPTION OF THE DRAWINGS

Various aspects of at least one example are discussed below with reference to the accompanying figures, which are not intended to be drawn to scale. Where technical features in the figures, detailed description or any claim are followed by reference signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

FIG. 2 is a plan diagram of a data center similar to the one shown in FIG. 1;

FIG. 6 is a block diagram of a data center employing containerized utility solutions in accordance with principles of the present invention;

FIG. 7A is an open view of a cooling container having a serpentine chilled water storage tank;

FIG. 7B is view of the cooling container of FIG. 7A having a serpentine chilled water storage tank with covered flooring;

DETAILED DESCRIPTION

Figure 1:
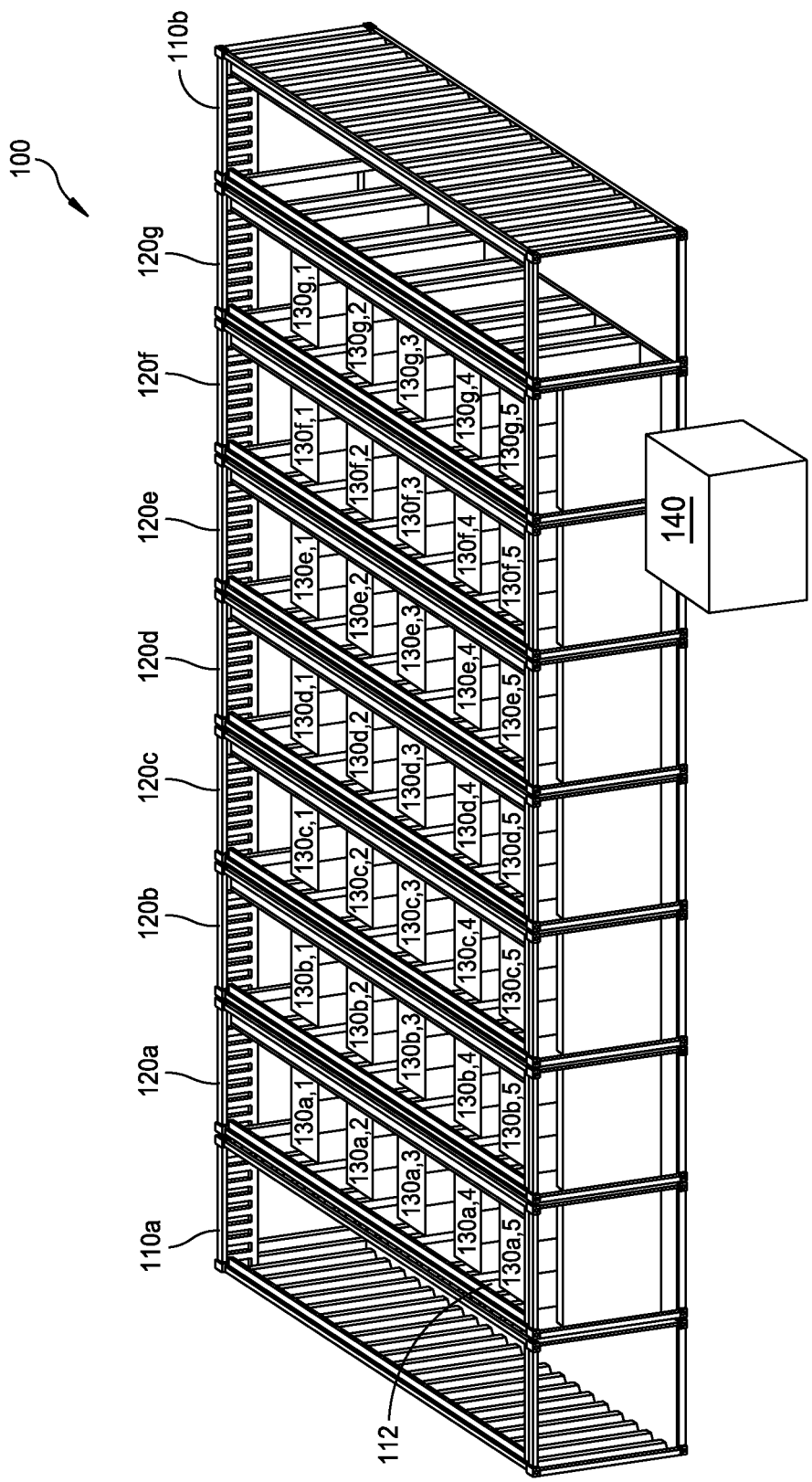
FIG. 1 is a layout of a data center assembled from shipping containers in accordance to principles of the invention.

Various embodiments and aspects thereof will now be discussed in detail with reference to the accompanying figures and attachments. It is to be appreciated that this invention is not limited in its application to the details of construction and the arrangement of components set forth in the following description or illustrated in the drawings and attachments. The invention is capable of other embodiments and of being practiced or of being carried out in various ways. Examples of specific implementations are provided herein for illustrative purposes only. In particular, acts, elements and features discussed in connection with one embodiment are not intended to be excluded from a similar role in other embodiments. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

FIG. 1 illustrates a layout of a containerized data center 100 assembled from a number of shipping containers 120a-120g populated with equipment enclosures $130_{x,y}$ (wherein "x" is the container, and "y" is the enclosure row within the container) installed in a "widthwise" configuration, as well as an end cap shipping containers 110a, 110b. Utility transformer 140 delivers power to the containerized data center 100.

Each shipping container 120 has a length greater than its width, and may typically be a standardized intermodal container having dimensions defined by the International Organization for Standardization (ISO). These standardized or ISO containers are the main type of equipment used in intermodal transport, and have typical dimensions of 8-foot (2.4 m) wide by 8-foot (2.4 m) high, with the most common lengths being 20 feet (6.1 m) nominal or 19 feet (5.8 m). Other dimensions may be used to house the equipment closures in a manner that allows for the forming of multiple rows of equipment enclosures, with each row formed perpendicular to the length of the container.

Prior containerized data center approaches employ equipment aisles running lengthwise down the container. These former approaches take advantage of the length of the containers to populate the container with a longer equipment row having a single access aisle. The former approaches utilize narrow aisles to access the components, with access often aided by doors on the outside. In embodiments consistent with principles of the invention, the equipment rows are configured in short rows that run perpendicular to the length, creating multiple rows within a given container. The multiple "widthwise" rows provide for aisles that span across multiple containers 120 that allow for scalability in configuring a containerized data center.

The shipping containers 120 have at least a single lengthwise sidewall opening 112 that is configured to connect with another shipping container 120 to create a single interior space, as well as a utility interface (not shown in FIG. 1) that is configured to connect at least one data center resource between the containers. The typical data center resources include, but are not limited to, data transmission connections, power lines, cooling gases or refrigeration lines. These shipping containers 120 may be transported as fully enclosed containers, having a removable side to provide the lengthwise sidewall opening 112.

As an example, in FIG. 1, shipping container 120a is populated with a number of equipment enclosures $130_{a,1}$, $130_{a,2}$, $130_{a,3}$, $130_{a,4}$, and $130_{a,5}$. These equipment enclosures may be server racks that house computer servers for storing data. Containers 120 b-d may be similarly populated. In other shipping containers within containerized data center 100, shipping container 120e is populated with a number of equipment enclosures $130_{e,1}$, $130_{e,2}$, $130_{e,3}$, $130_{e,4}$, and $130_{e,5}$ that can house cooling units that supply cooling gases to the rest of the containerized data center 100. Container 120f may be similarly populated with cooling units. In some embodiments, the plurality of equipment enclosures $130_{x,y}$ may be installed within a container such that they are configured to connect with other equipment enclosures $130_{x,y}$ in a manner that forms a plenum between the equipment enclosures and a widthwise wall of the first container. This plenum may be used to segregate and contain with the plenum the cool air supplied by cooling equipment or the hot air exhausted by servers, depending on the selected configuration of the containers 120. In other embodiments, shipping container 120g is populated with a number of equipment enclosures $130_{g,1}$, $130_{g,2}$, $130_{g,3}$, $130_{g,4}$, and $130_{g,5}$ that can house power distribution equipment or switch gear that supply power to the rest of the containerized data center 100.

Figure 2:
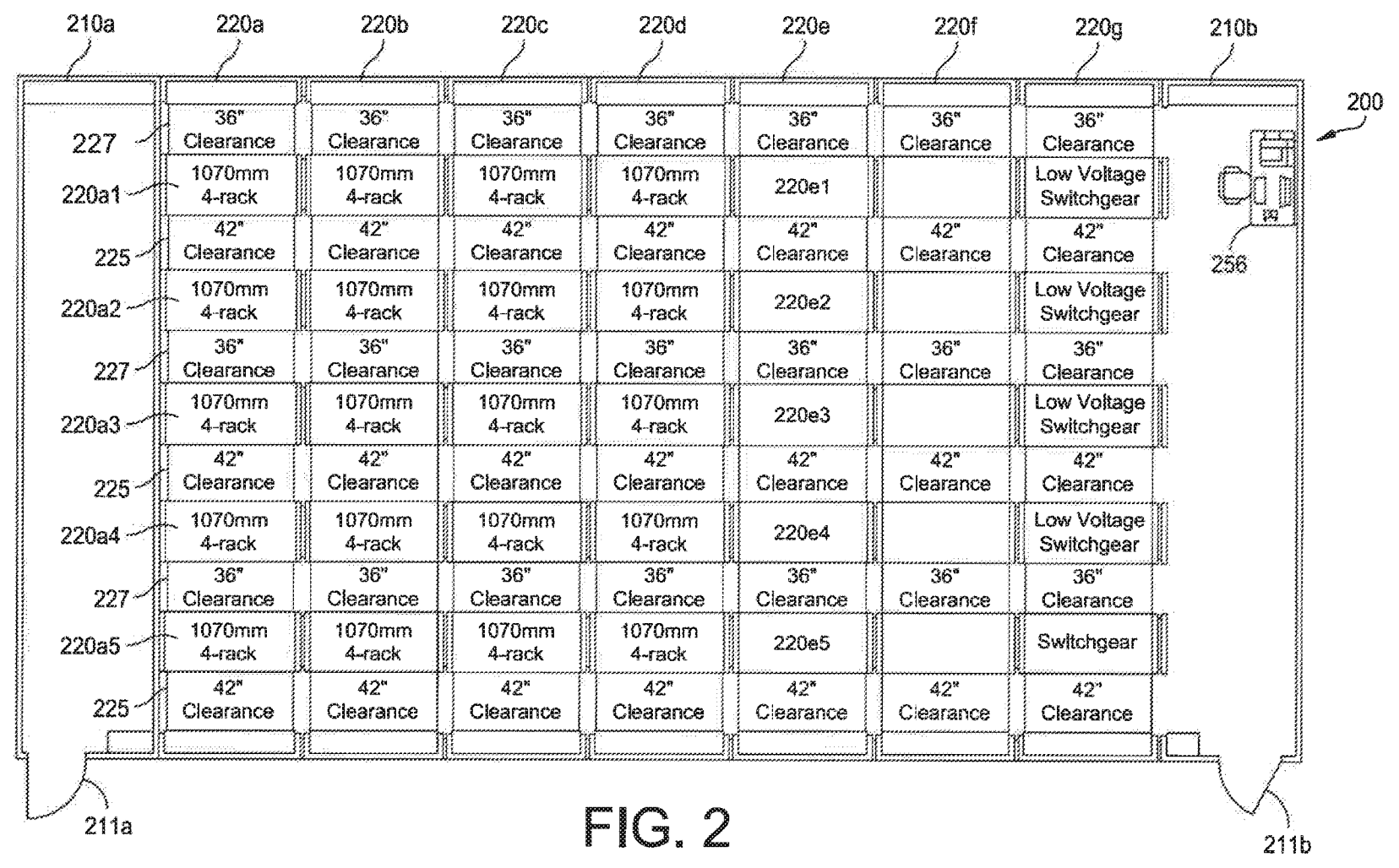

FIG. 2 is a plan diagram of a data center similar to the one shown in FIG. 1. The containerized data center 200 has two end cap containers 210a and 210b that provide access into the containerized data center 200. The end cap containers 210a and 210b have entryways 211a and 211b, respectively, and may include room for office equipment, such as a desk 256. The end cap containers 210a and 210b provide access to the widthwise aisles formed by the equipment containers 220b-g. In the configuration shown in FIG. 2, the equipment access aisles 225 have roughly 42 inches of clearance, and the exhaust aisles 227 have roughly 36 inches of clearance. One of skill in the art will recognize that other embodiments of the invention may have different aisle dimensions depending on the size of the containers, as well as the nature of the equipment enclosure configurations.

Shipping container 220a is populated with a number of equipment enclosures $220_{a,1}$, $220_{a,2}$, $220_{a,3}$, $220_{a,4}$, and $220_{a,5}$. Containers 220 b-d may be similarly populated. In other shipping containers within containerized data center 200, shipping container $220_e$ is populated with a number of equipment enclosures $220_{e,1}$, $220_{e,2}$, $220_{e,3}$, $220_{e,4}$, and $220_{e,5}$ that can house cooling units. Container 220f may be similarly populated with cooling units.

Shipping container 220g is populated with a number of equipment enclosures $220_{g,1}$, $220_{g,2}$, $220_{g,3}$, $220_{g,4}$ and $220_{g,5}$ that can house power distribution equipment or switch gear. The switchgear is arranged in the rows as shown, such that bus bars connect along the top of each rack and carry the electrical current across the rows of equipment enclosures $220_{a-g,1}$, $220_{a-g,2}$, $220_{a-g,3}$, $220_{a-g,4}$, and $220_{a-g,5}$ as needed. The distribution output first goes to the uninterruptible power supplies in the enclosures where the power is converted to uninterruptible service. An over the rack circuit breaker distributes power to its rack. Bus bars continue to pass service to the next container.

In various embodiments, each rack may include current and voltage monitoring systems for reporting to a central management system. Further, temperature and airflow sensors, or other environmental sensors may be used to monitor the data center environment and report to a management system.

Using either a combination of shipping containers or shipping containers and conventional data center buildings, a modular data center that includes shipping containers populated with data center equipment may offer a number of advantages. The containers may be shipped preconfigured with racks, UPS, distribution, and cooling equipment. The use of modular containers pre-populated with standard, pre-tested data center equipment allows for lower lead time and a highly scalable data center architecture, having less capital cost than conventional data centers. The containerized support may provide N+1 redundancy (where components (N) have at least one independent backup component (+1)) or 2N redundancy (where components (N) have a duplicate) as may be demanded. To prevent single points of failure, the elements of the electrical systems, including backup system, may be duplicated, and critical servers are connected to multiple power sources. Switches systems may be used between multiple containers to ensure instantaneous switchover from one supply to the other in the event of a power failure.

As a series of pre-planned and specified modules, they may provide standard regulatory clearances for local code compliance and may make efficient use of real estate compared to other container solutions. Understanding and pre-testing the standard equipment that may be used in individual containers may make it easier to plan and optimize the containerized data center architecture. Using modified ISO shipping containers, the data center containers may be shipped anywhere in the world by sea, rail, truck. They may be assembled on site by using standard handling equipment such as a crane.

Figure 3:
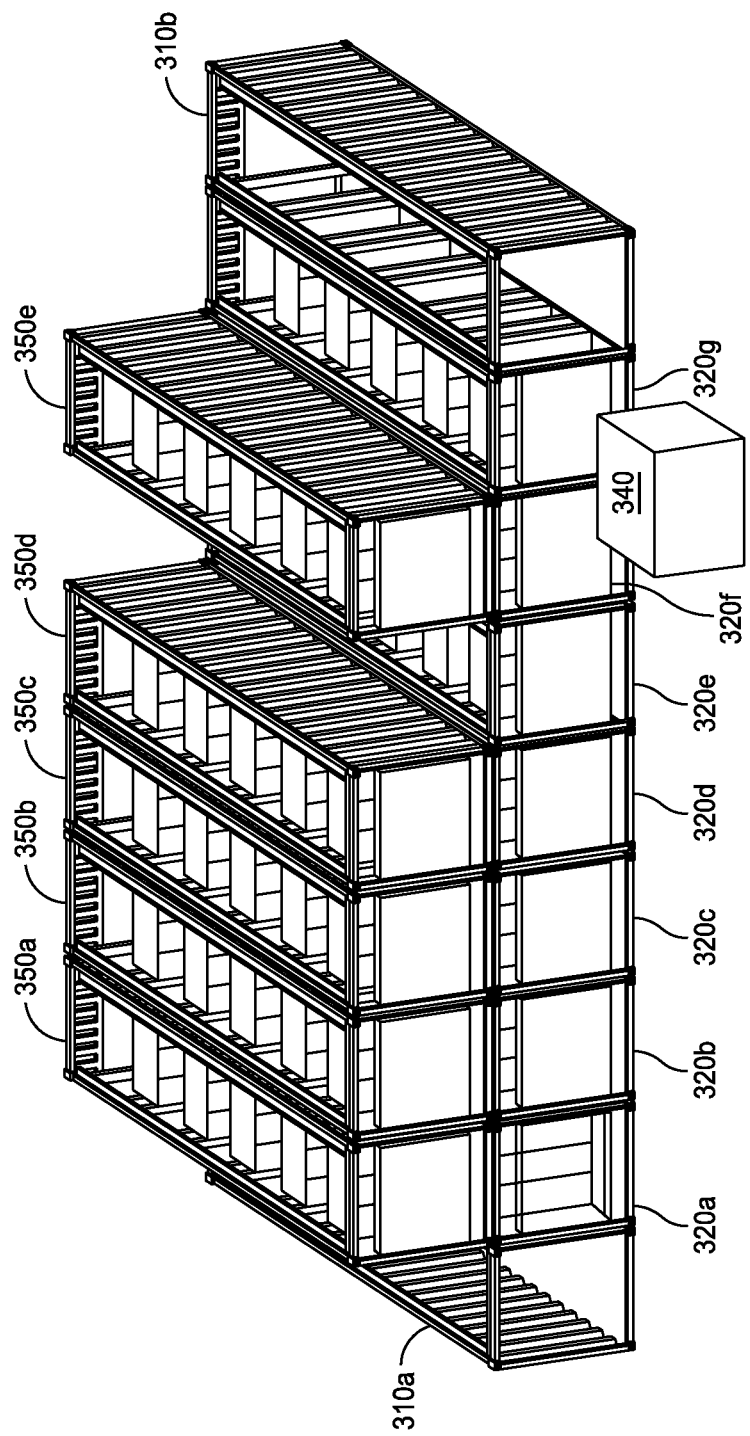
FIG. 3 is an alternate layout of a data center assembled from shipping containers in accordance to principles of the invention.

FIG. 3 is an alternate layout of a containerized data center 300 assembled from shipping containers 320a-320g populated with equipment enclosures (not shown in FIG. 3) installed in a "widthwise" configuration and end cap shipping containers 310a, 310b. The containerized data center 300 further includes a number of cooling units containers 350a-e that are "stacked" on shipping containers 320a, 320b, 320c, 320d, and 320f. The cooling units containers 350a-e may provide overhead cooling to the widthwise rows in the below equipment enclosures. The cooling units 350a-e may be shipped as a standalone container, or may be shipped with equipment enclosures in a double stack container. Utility transformer 340 delivers power to the containerized data center 300.

Figure 4:
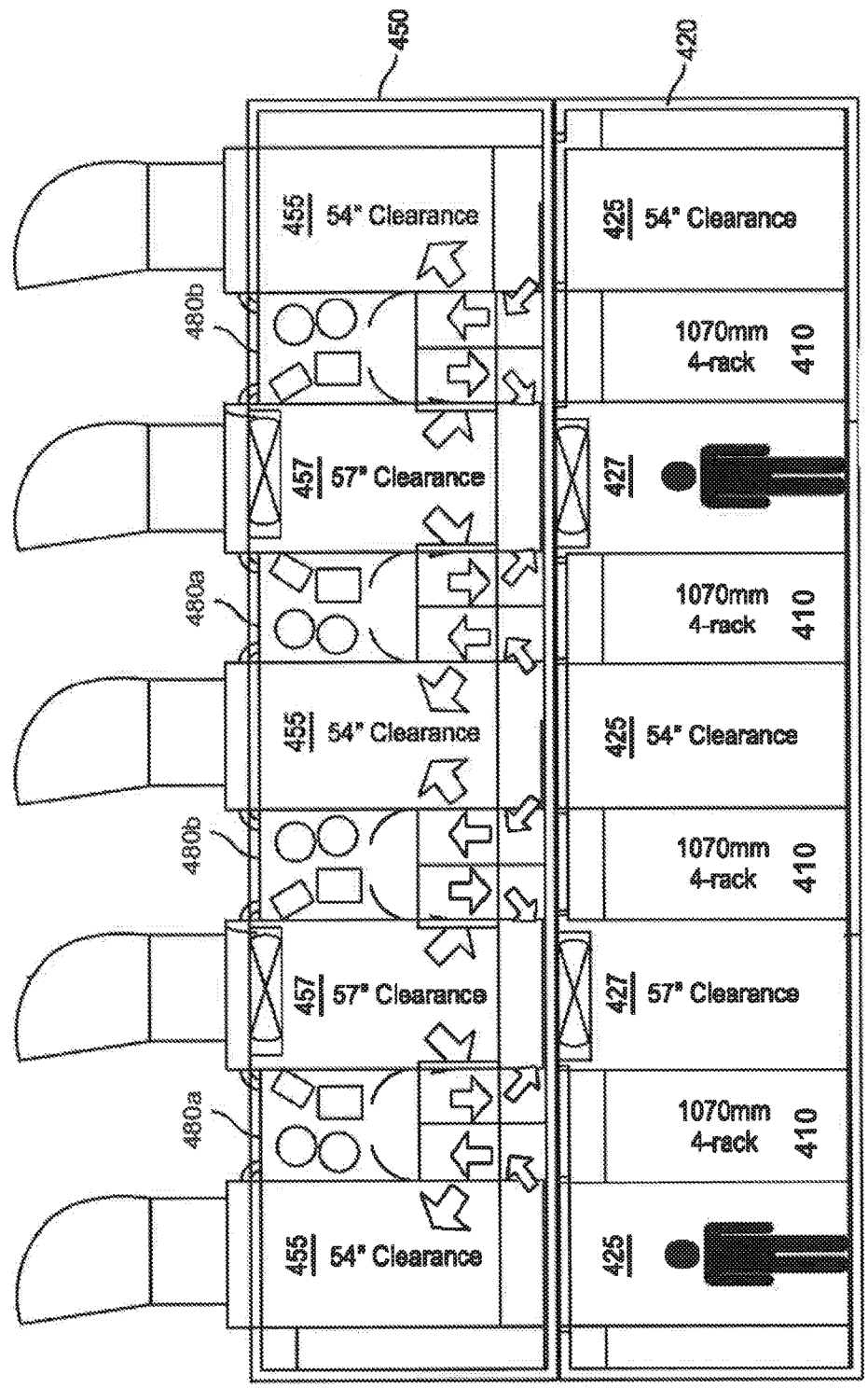
FIG. 4 is a cross-sectional view of a data center assembled from shipping containers employing a top mounted cooling shipping container.

FIG. 4 is a cross-sectional view of one embodiment of a data center assembled from shipping containers employing a top mounted cooling container 450. The data center equipment container 420 is populated with a number of equipment racks 410 configured in a widthwise arrangement. The racks 410 are arranged such that they draw cool air from a contained cool aisle 427 to provide cooling of the data center equipment in the racks 410. The equipment in the racks 410 exhaust hot air into the contained hot aisle 425. These cold aisle 427 and hot aisle 425 arrangements are used to ensure that the heat producing electronic equipment in the racks 410 do not overheat. A cooling unit container 450 may sit on top of the equipment container 420 to provide cooling to the systems below.

In the embodiment shown in FIG. 4, the hot air that is expelled by the equipment into the indoor hot aisle 425 may pass over the plate air to air exchanger of chiller unit 480a and be cooled by the incoming outdoor air via upper outdoor cold aisle 457. The indoor air gets cooled and gets directed to the indoor cold aisle 427. Such air can be supplemental cooled by chiller evaporator 480b to maintain desired indoor cold aisle temperatures. The outdoor air from upper cold aisle 457 that cools the plate to plate air exchanger gets warmed up through passage through the exchanger while removing heat from the lower hot aisle 425. This outdoor air then vents through upper outdoor hot aisle 455 into the atmosphere. The aisles 455, 457 of the cooling container 450 allow the cooling components to be accessible and serviceable. This cooling system allows for efficient "free air" cooling without the risk of introducing outside dust and debris into the data center. Those of skill in the art will understand that various types of cooling modules may be used in connection with a cooling unit container 450. For example, the upper chillers can be replaced by straight chiller evaporator coil cooling between hot aisle 425 and cold aisle 427, whereas the condenser loop of the chiller would reject the heat into the atmosphere. In another example direct free cooling can be employed to exhaust the hot air from hot aisle 425 and bring in outside air to cold aisle 427.

In the above examples, containers were shown to be specialized to power distribution, UPS, Cooling, IT. However, one of skill in the art will recognize that widthwise rows can also be applied to modules containing a combination of those elements such that enough of each of those elements is sufficient to provide a complete data center of certain power capacity.

Figure 5:
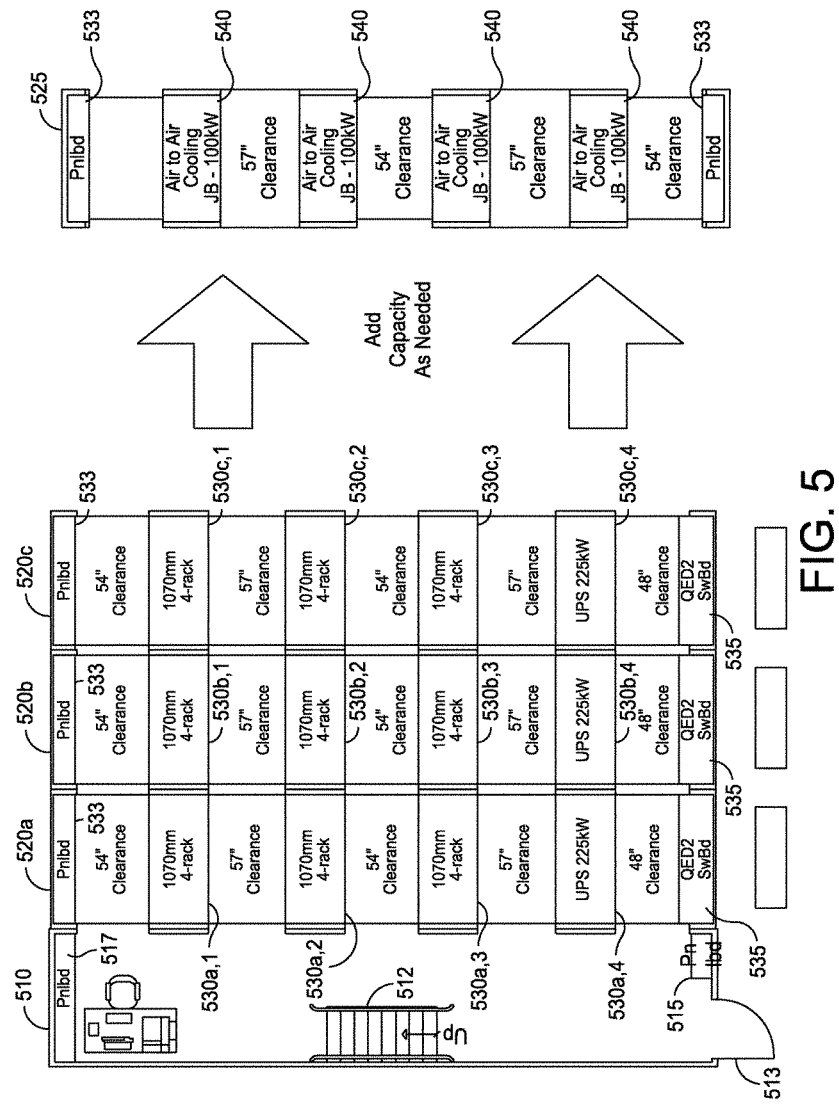
FIG. 5 is a plan diagram illustrating the scalability of a containerized data center solution in accordance with principles of the invention.

FIG. 5 is a plan diagram illustrating the scalability of a containerized data center 500 solution. An end cap container 510 provides access 513 into the containerized data center 500, and includes panel boards 515, 517 that serve as connections for providing power to any additional data center equipment.

Adjacent to the end cap container 510 is data center container 520a having several equipment racks $530_{a,1}$, $530_{a,2}$, $530_{a,3}$ that may be used for housing servers. In addition, data center container 520 also houses a UPS $530_{a,4}$ and a power panel board 533 and switchboard 535. Panel boards and switch boards are used as needed to provide redundant power paths, protection from faults, and allow electrical isolation of individual lines for service and maintenance while providing continual operation of the data center. Those of skill in the art will understand the selection of panel boards or switchboards depending on the amperage and complexity of the distribution along with integration of discrete point to point wiring verses the use of integral switch gear buss bars. The panel board 533 and the switchboard 535 may have similar functions, but may differ in their construction. In general, switchboards may be generally deeper and are typically floor standing, whereas panel boards are typically shallower and wall mounted.

Similar data center containers 520b, 520c, may be installed in series, depending on necessary data center requirements. Although only three equipment containers 520a, 520b, 520c are shown in the configuration of FIG. 5, the modularity of the data center containers allows for additional equipment containers to be added in series.

Depending on the data center configurations, and necessary cooling capacity for which the data center configuration may require, cooling containers 525 may be added on in series to the data center containers 520a, 520b, 520c. Cooling container 525 includes cooling units 540 that may provide cooling to the rest of the containerized data center 500. While not shown in FIG. 5, additional equipment containers may be added adjacent to cooling container 525 to provide room for additional servers or power switching equipment.

Having lengthwise sidewall openings, the multiple containers contain equipment enclosures that create aisle openings to provide access to the equipment. It will be understood by one of skill in the art that data center containers 520a, 520b, or 520c may be populated with different types of data center equipment, and may be configured and installed interchangeably, depending on customer need. For example, a single module may be equipped with power, UPS, cooling, and IT space.

As shown with respect to FIG. 3, the cooling containers 525 may be configured to install on the top of a data center container 520a, 520b, or 520c. In such as case, the end cap container 510 can be equipped with a stairway 512 to provide access from the end cap container 510 to the second level.

This flexible approach using lengthwise sidewall openings and widthwise rows of equipment enclosures provides a data center designer with highly scalable data center solutions. The ultimate capacity of such a setup might be limited by aisle length (where intermediate "office" modules may be used) or other limits, such as, the geographical footprint.

The containerized support may provide N+1 or 2N reliability as may be demanded. To prevent single points of failure, all elements of the electrical systems, including backup system, are typically fully duplicated, and critical servers are connected to both the "A-side" and "B-side" power feeds. This arrangement is often made to achieve N+1 Redundancy in the systems. Static switches are sometimes used to ensure instantaneous switchover from one supply to the other in the event of a power failure.

FIG. 6 is a block diagram of a data center employing containerized utility solutions in connection with a conventional building. Conventional building methods integrate the power distribution, power, cooling in the building itself, after forcing a data center owner to invest up front capital in building future or speculative capacity on a long lead time project with uncertain demand. Each data center is a long lead time, expensive, custom engineered project.

Containerized IT space and support solves this problem, but introduces other issues, such as serviceability and accessibility of IT equipment, especially in severe weather, or issues with local building codes that may restrict container placement. In some circumstances, it may be beneficial for an organization to use existing indoor IT space 600 and supplement the capacity with additional containerized services 610, 620. Here, a data center owner may construct an inexpensive shell where they can show prospective clients IT capacity and space. A containerized support package allows engineered and tested and field proven reliability to be delivered to the customer every time. Components can be hot-replaced in the containers while providing continuous service. Entire containers can be replaced as necessary and refurbished at a location away from the client data center.

FIGS. 7A and 7B illustrate an example cooling container 700 that may be used as a specialized air-cooled chilled water supply containerized service to a data center. Generally, in conventional monolithic style chiller systems redundancy is achieved through adding a 2nd (or 3rd or 4th) identical large chiller which is on standby until needed, adding to capital expenditures. These redundant chillers take time to come on line due to size, and need manual intervention to do so. Chillers are not automatically rotated in and out of service and so wear is concentrated in the in-use chillers until a redundant chiller comes on line due to a failure or a primary unit. Furthermore, most chiller systems do not incorporate free cooling into their standard configuration.

While modular small chiller units are available which can be interconnected to form a larger cohesive chiller unit, these units cannot be completely removed from the overall chiller unit without disrupting chilled water flow.

FIG. 7A shows an open view of the cooling container 700 that uses a serpentine chilled water storage tank. The serpentine chilled water tank consists of a number of straight pipe sections 710 joined by elbows 720 to complete a serpentine or folded path. Such pipes can conform to the American National Standards Institute (ANSI) Schedule 40 Type steel pipes. Each end 715a, 715b of this pipe system has a connection to be in series with the overall chilled water system. Chilled water enters one connector end 715a of this pipe system storage, travels through the serpentine or folded path, and exits the other connector end 715b. The chilled water tank allows thermal capacity in the event of loss of primary power. In addition, chilled water storage helps regulate or dampen the operation of a chiller system.

The sequential nature of flow in such a long pipe helps assure that water exits the chilled storage in a First-In-First-Out (FIFO) manner, assuring that colder water serves the load as opposed to incoming water. This becomes important in a power failure where the chillers are not working, as it prevents warm return water from finding a "shortcut" to the chilled water output. The shape of the elbows and diameter of the pipe can be optimized to minimize pressure drops while maintaining chilled water capacity and the sequential FIFO flow of the system. Flooring panels 750 can be placed within the cooling container to cover the serpentine pipe as shown in FIG. 7B. The flooring panels 750 can be placed along a support frame 740 to provide stability and structure. Doors 730 can be used to provide access into the container system.

Figure 8B:
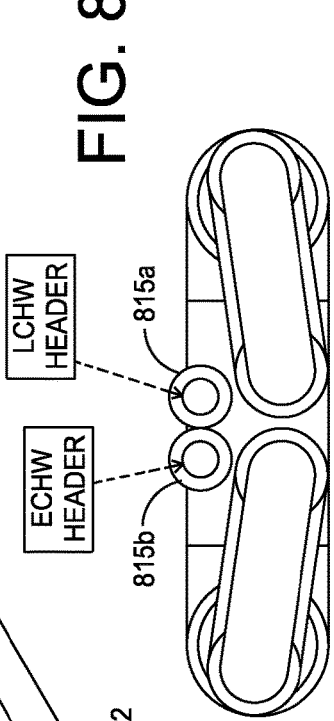
FIG. 8B is an end view of a serpentine chilled water storage tank.
Figure 8A:
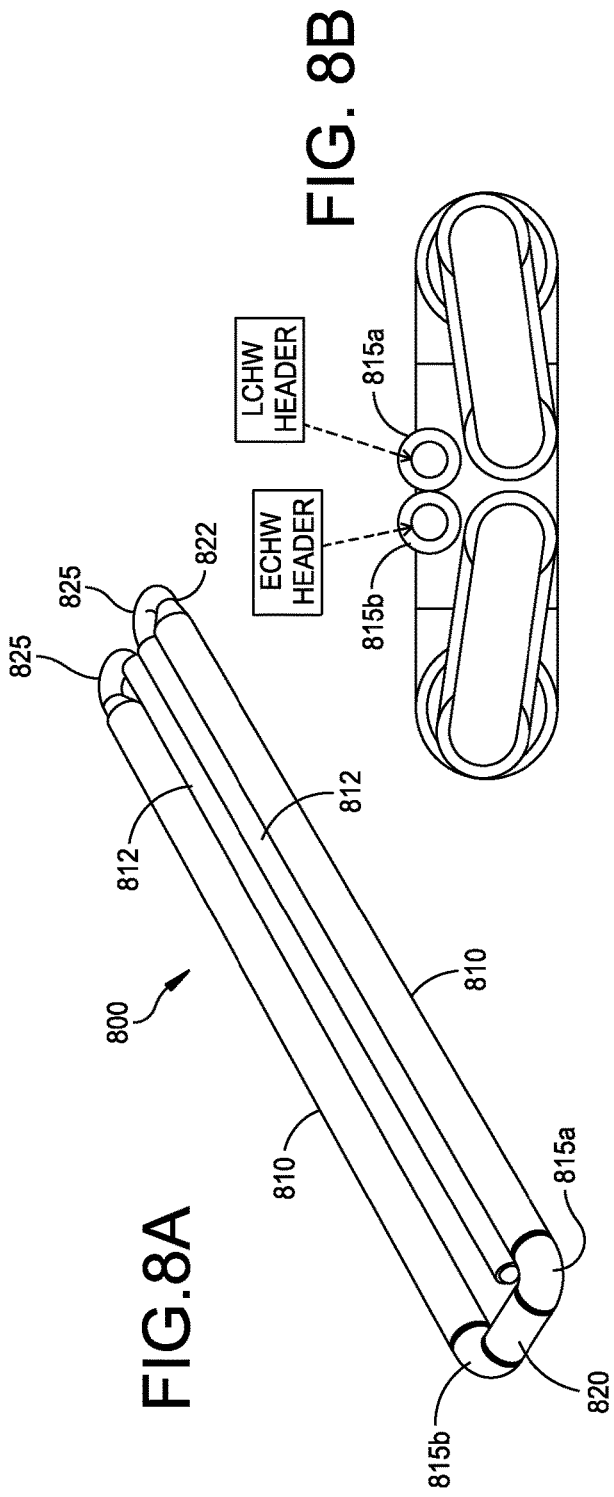
FIG. 8A is a perspective view of a serpentine chilled water storage tank.
Figure 8C:
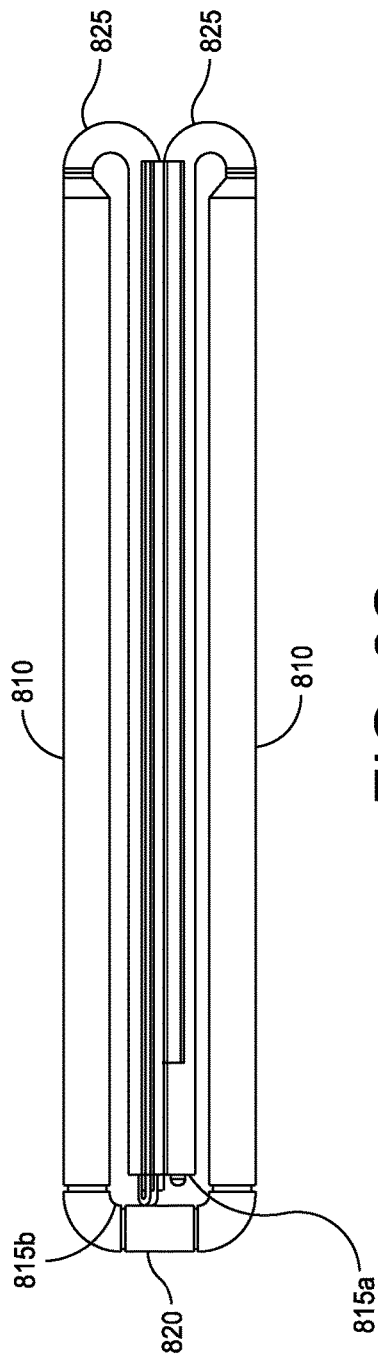
FIG. 8C is a top view of a serpentine chilled water storage tank.

FIGS. 8A-C shows an alternative serpentine chilled water storage tank 800 that may be used in connection with the cooling container 700 of FIGS. 7A and 7B. FIG. 8A shows a perspective view of the serpentine chilled water storage tank 800. FIG. 8B shows a cross-sectional end view of the serpentine chilled water storage tank 800. FIG. 8C provides a top view of the serpentine chilled water storage tank 800. The chilled water storage tank 800 has two long storage pipes 810 that form the two exterior lengths of the storage tank 800. In one embodiment, these pipes 810 may conform to the ANSI Schedule 40 Type steel pipes, and have a diameter of 18 inches. At one end, the two storage pipes 810 are joined by a large elbow connector 820. On the other ends, each of the two storage pipes 810 is connected to reducer that brings the diameter of the piping down to a 10 inch diameter, and joins each of the storage pipes 810 to a smaller elbow connector 825. These smaller elbow connectors 825 extend into two smaller storage pipes 812 that each have an end 815*a*, 815*b* respectively. Chilled water enters one connector end 815*a* of this pipe system storage, travels through the serpentine or folded path, and exits the other connector end 815*b*.

Figure 9:
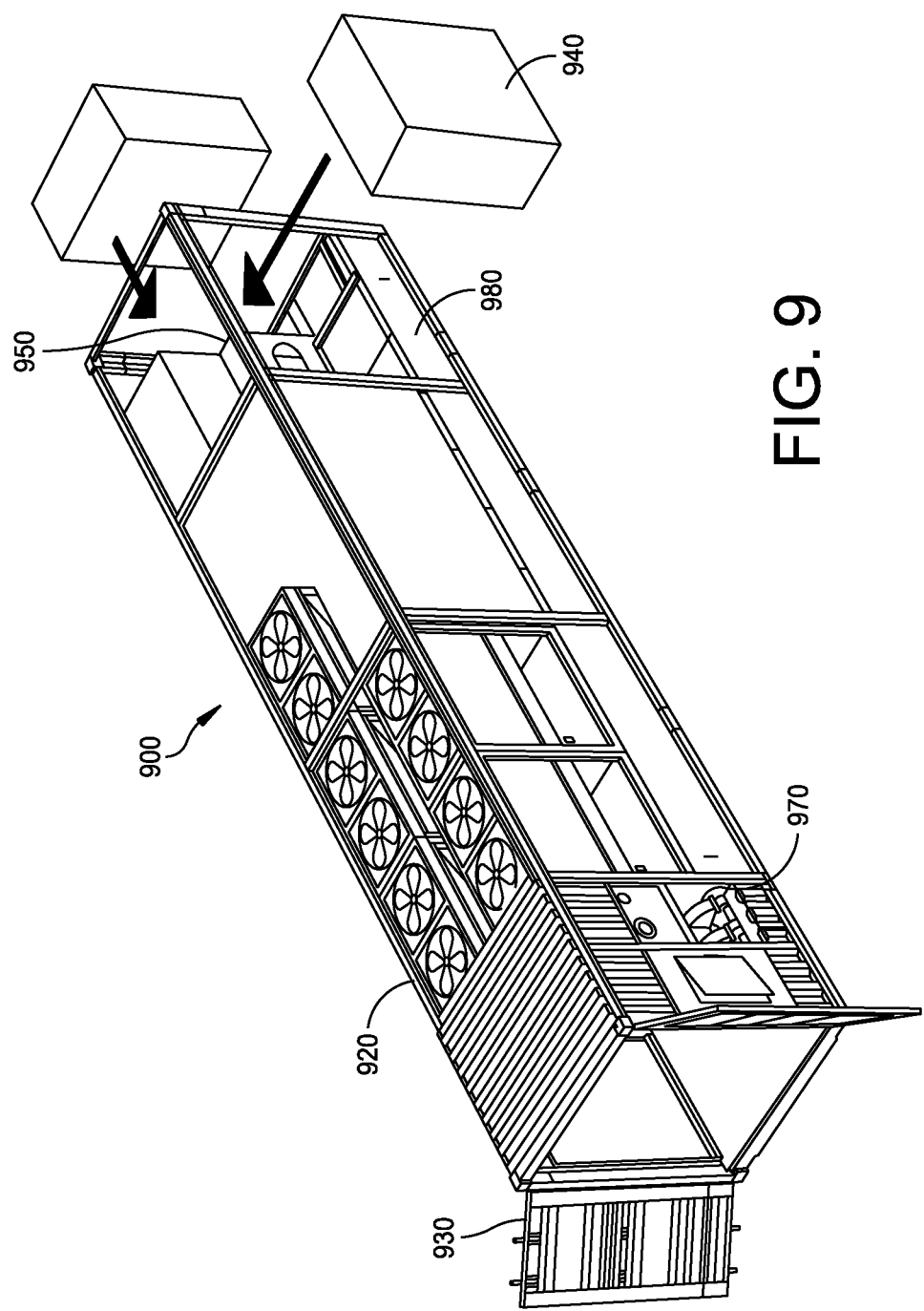
FIG. 9 is a side view of cooling container having modular cooling units and chiller units.

FIG. 9 is a side view of cooling container 900 having modular free cool units 920 and chiller units 940. The container 900 is built up with an insulated structure 980 over the serpentine or folded storage tank (not shown in FIG. 9). The use of the tank as a chilled water loop provides an integrated hydronic system within the cooling container 900.

Along the length of the cooling container 900 is a system of chilled water headers and an electrical distribution system is installed as a central "spine" 950, with water and electrical connections at pre-determined intervals. The free cool units 920 typically consist of a set of water-to-air heat exchange coils, with matching fans and controls, in a frame of a size to match the pre-determined intervals of the connections along the spine 950. The chiller units 940 typically consist of a set of compressors, an evaporator, a set of air-cooled condenser coils, valves, controls, sensors and fans, again in a frame sized to match the pre-determined intervals of the connections along the spine 950.

Within the container 900, a pump system 970 and plumbing may be connected. In some embodiments, a dual redundant pump system may be used based on typical system requirements. The pumps may provide for N+1 or 2N redundancy, for example, by using two pumps where one is sufficient. Valving allows for one pump to be isolated from the plumbing circuit and the pump or motor to be maintained or replaced. In some of these embodiments, each N+1 or 2N pump circuit may have accessible strainers in the isolation path, where one path can be isolated and the strainer can be accessed and cleaned out while the other path continues to run.

Depending on the geographical and necessary cooling capacity required by a data center site, the free cool units 920 and the chiller units 940 may be interchangeably added to optimize the data center resources. Chiller capacity is broken into smaller chiller modules 940, and the chiller container may contain N+1 chiller modules. For example in a 150 ton chiller container there may be six 30 ton chiller modules. If a chiller module 940 fails or needs to be serviced, the other five chiller modules 940 may continue to provide full rated 150 ton cooling while that failed module is being serviced.

In some embodiments, service can be on an individual chiller module 940 that has been switched off while the others are still running Such "service" may include maintaining, repairing, or replacing a component, or replacing an entire chiller module.

In some embodiments, each chiller module 940 may contain a slave control to provide operation. In addition a master control may coordinate the operation of the chiller modules 940 for efficient and reliable operation. Upon the loss of the master each slave control will command its chiller module 940 to operate, providing full capacity but reduced performance (e.g. efficiency and smooth operation) until the master controller is replaced.

Embodiments of the invention also allow free cool modules 920, where similar to the chiller modules 940, the free cool modules 920 can be isolated and serviced or replaced while the system is running. While a container having N+1 redundancy provided within each chiller container 900 is described herein, one of skill in the art will understand that is possible to have each chiller container 900 provide to capacity and achieve redundancy by adding an extra chiller container 900 to the overall system.

The cooling container described in connection with FIG. 9 provides a configurable cooling solution that allows for a mix of free cool and chiller capacity to fit in a standard ISO shipping container footprint. The modularity and common interfaces to the spine 950 allows for customized free cool or chiller capacity, and is easily scalable—a central spine 950 of chilled water and electrical distribution allows chillers to be added quickly as datacenter loads grow. The central spine 950 may allow for any chiller module 940 or free cooling module 920 to be disconnected from the others, or units added for more capacity, without disrupting chilled water supply to the datacenter load.

Further, embodiments of the cooling container 900 may provide a highly efficient solution as intelligent control of individual chiller units, as only the chiller capacity needed for a given load will run. Chillers can be switched on and off as the demand varies allowing each chiller to operate in its most efficient load point. As a self-contained cooling solution, the cooling container 900 may assist a data center designer in saving up-front capital investment, construction costs, unknown reliability issues of a custom design, and delivery time.

Figure 10A:
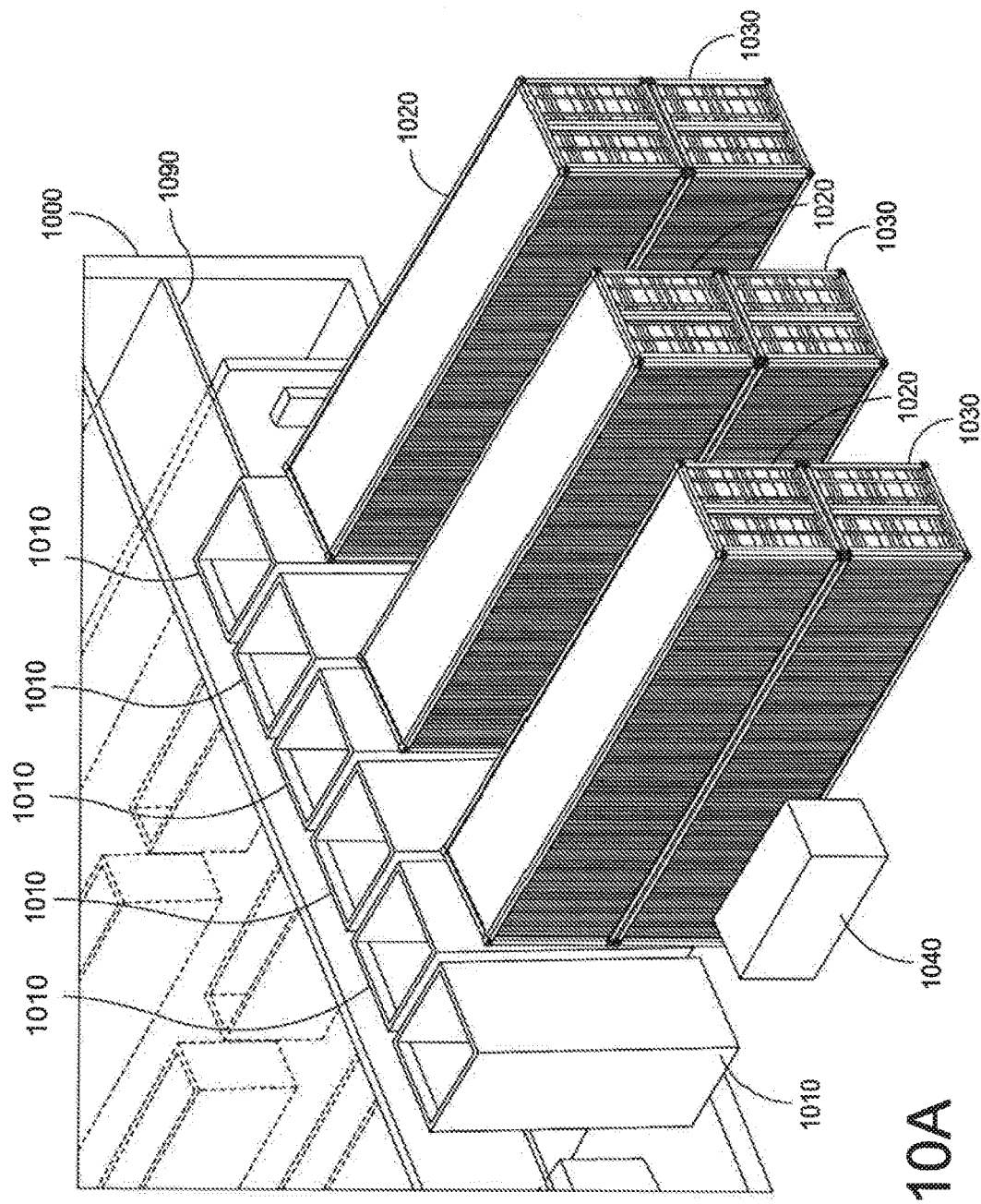
FIG. 10A is an exterior perspective view of a data center installation in accordance with principles of the invention.
Figure 10B:
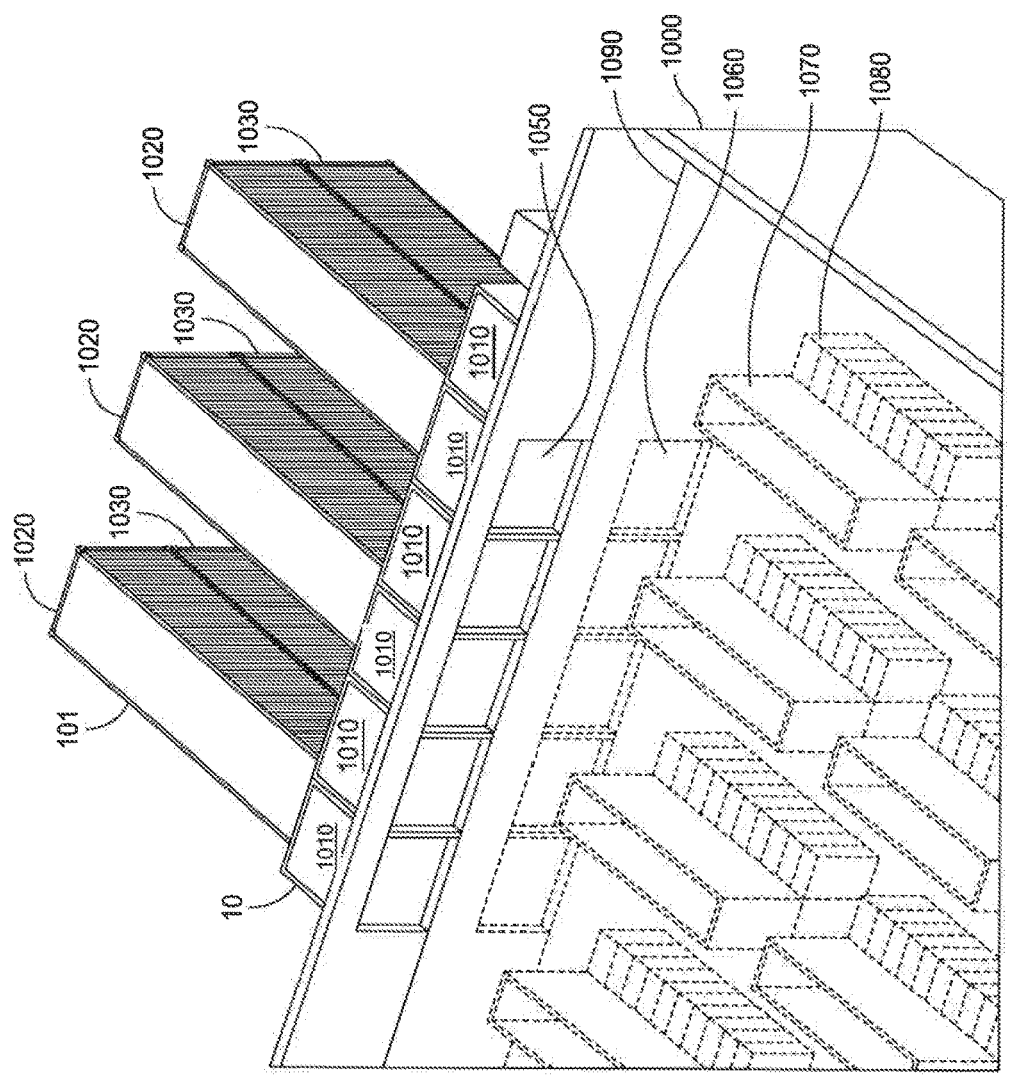
FIG. 10B is an interior perspective view of the data center installation of FIG. 7A.

The cooling container 900 described above may be used to support a modular data center as described in connection with FIG. 1, or to support a hybrid system as described in connection with FIG. 6. FIG. 10A is an exterior perspective view of a data center installation that shows an embodiment of a hybrid data center installation that combines a conventional data center building 1000 with external containerized services, such as the cooling container 900. FIG. 10B provides the interior perspective view of the same data center installation.

Attached to the exterior of the data center building 1000 are several vertically mounted air handling containers 1010. The air handling containers 1010 may be paired to a chiller container 1020 to provide air movement to pull warm air out of the data center 1000 and provide cool air into it. As shown in installation of FIG. 10A, the air handling containers 1010 may be paired to a chiller container 1020 in a 2:1 ratio, with air flow between the air handling containers provided through openings in the container sidewalls. By using a 2:1 or other ratio of air handling containers to chiller containers, the installation can promote low speed airflow and efficient operation and also allows for increased air capacity to match any cooling capacity. Having separate containers for air handling and air cooling functions also provides increased scalability by allowing upgrades of individual containers. For example, an installation may upgrade to a more efficient chiller container, while maintaining compatibility to an air handling container. This discrete functionality of containers provides some flexibility in meeting specific site requirements.

From the interior perspective view of the data center installation, a number of equipment racks 1080 may be installed within the data center 1000. As shown, the equipment racks may be configured such that the equipment is positioned to expel hot exhaust air into a contained "hot aisle" having an exhaust plenum 1070. The exhaust plenums 1070 channel the hot exhaust air into larger plenum created within the data center 1000 by a ceiling divider 1090 (shown in a transparent view). Ceiling divider 1090 provides separation between the hot air exhaust of the hot aisles above the divider 1090, and the cooler data center air below.

Hot air may be drawn from the ceiling plenum through exhaust openings 1050 by the air handling containers 1010 and cooled by chiller containers 1020. The air handlers 1010 may typically be equipped with large fans (not shown) to draw the air through. Once cooled, the cool air may be provided back into the data center 1000 though cool air openings 1060. While the exhaust openings 1050 and the cool air openings 1060 shown in FIG. 10B appear to be large relative to the container size, by splitting the air handling containers 1010 into smaller units, one can use smaller holes and hence less structural modifications to a building.

Referring again to FIG. 10A, the data center installation also provides scalable power support to the data center 1000 through the use of electrical distribution containers 1030. Within the electrical distribution containers 1030, may be an arrangement of switchgear, and UPS devices, pre-installed. A utility transformer 1040 delivers power to the containers 1030 for distribution to the data center 1000.

In the installation shown, the chiller modules 1020 can be installed to sit on top of the electrical distribution containers 1030. Arrangement of such stacked containers against the outside wall of a building allows for efficient space utilization of power container 1030 with chiller container 1020 with minimal added real estate. Further, by raising the chiller containers 1020, this allows the air intake of the chiller containers to be raised off the ground, helping keep out dust and contaminants. The configuration shown also provides the rejection air exhaust from chiller containers 1020 to be directed out the top of the container, minimizing recirculation of hot air.

With such an installation, power can connect from the electrical distribution containers 1030 via small access holes (not shown) in side of building, and can route in cables or buss bars raceways through the data center 1000. Further, a liquid loop may also connect via small access holes in side of building directly from the chiller containers 1020.

Figures 11A, 11B:
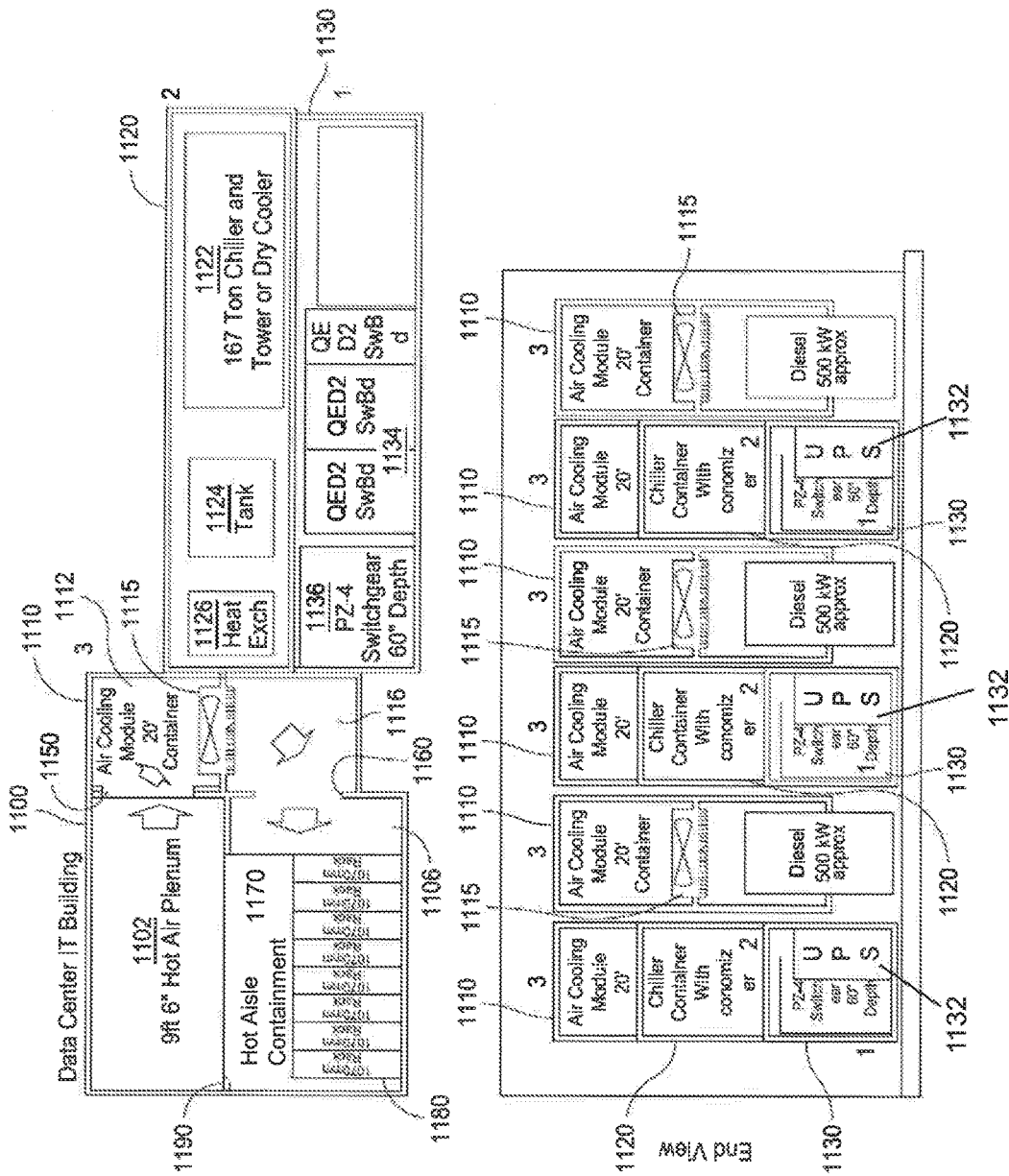
FIG. 11A is a side view of a data center installation of FIG. 7A.
FIG. 11B is an end view of a data center installation of FIG. 9A.

FIGS. 11A and 11B are a side view and an end view, respectively, of a data center installation of FIG. 10A. Data center 1100 has a number of equipment racks 1180 installed within the data center 1100. The equipment racks 1180 expel hot exhaust air into a contained hot aisle that is channeled into an exhaust plenum 1170. The exhaust plenums 1170 channel the hot exhaust air into larger plenum 1102 created within the data center 1100 by a ceiling divider 1190.

Attached to the exterior of the data center building 1100 is vertically mounted air handling container 1110. The air handling container has a large fan 1115 for drawing air out of the exhaust openings 1150 and supplying it back through the cool air openings 1160. The air handling container 1110 is paired to a chiller container 1120 that cools the hot exhaust air drawn into the air handling container so that cool air can be supplied back into the data center 1100. The chiller container 1120 may include among other equipment, chiller modules 1122, a water tank 1124, and a heat exchanger 1126. One of skill in the art will recognize that a pre-engineered chiller container may contain other equipment (not shown) to enable to cooling of the hot exhaust air, including free cooling modules, or water pumps.

As in the installations of FIGS. 10A and 10B, the chiller containers 1120 of FIGS. 11A and 11B are installed on top of electrical distribution containers 1130. These containers may be populated with a variety of electrical equipment such as one of more UPS 1132, switchboards 1134 and switchgear 1136. As a pre-engineered distribution container, the type of equipment may be determined to provide scalable power support to meet particular data center requirements for power or redundancy.

As in the installations of FIGS. 10A and 10B, the chiller containers 1122 of FIGS. 11A and 11B are installed on top of electrical distribution containers 1130. These containers may be populated with a variety of electrical equipment such as one of more UPS 1132, switchboards 1134 and switchgear 1136. As a pre-engineered distribution container, the type of equipment may be determined to provide scalable power support to meet particular data center requirements for power or redundancy.

Figure 12:
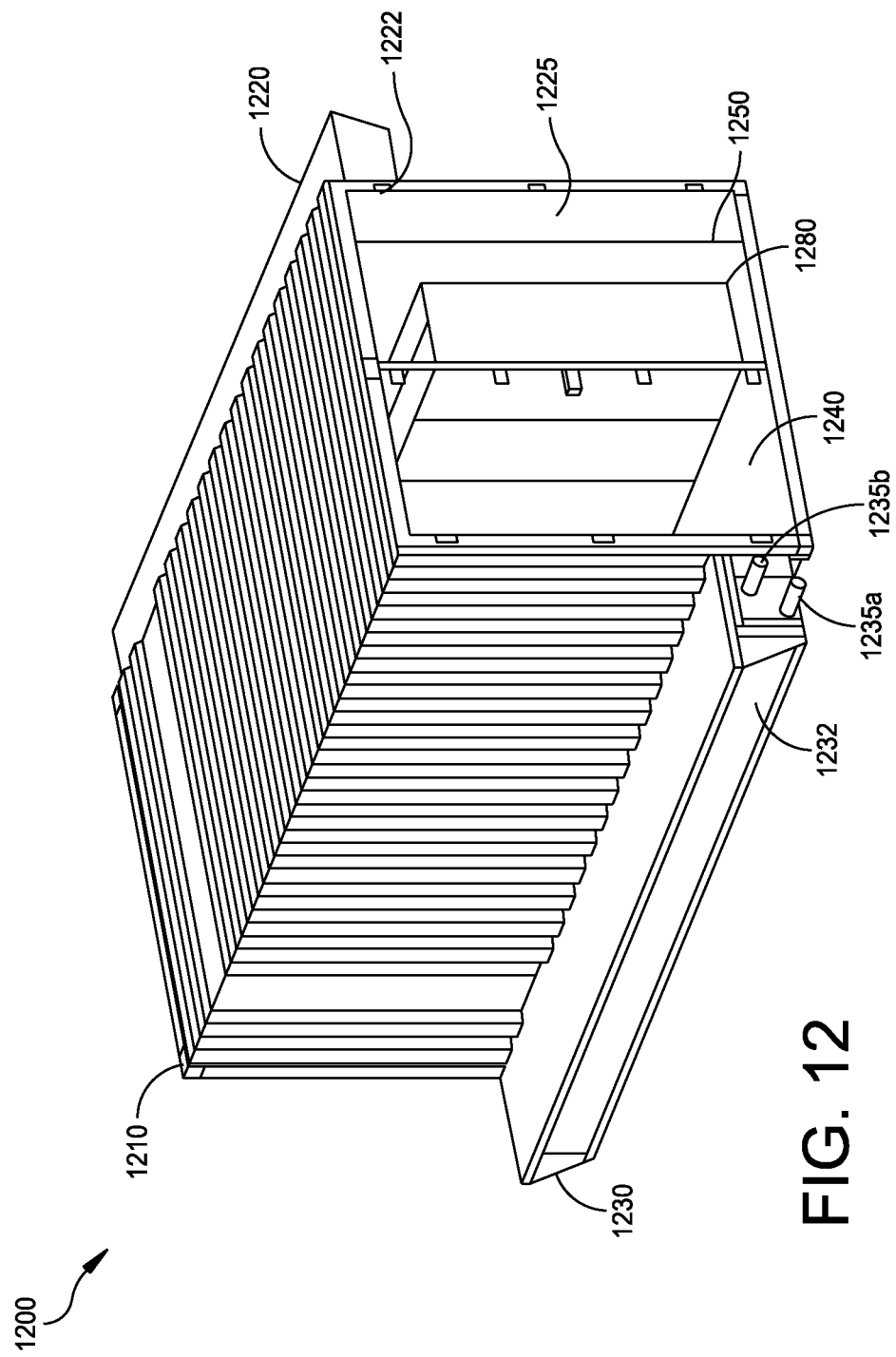
FIG. 12 is a perspective view of a containerized datacenter in accordance with principles of the invention.

FIG. 12 is a perspective view of a containerized datacenter 1200 in accordance with principles of the invention. A shipping container 1210 houses electronic equipment enclosures 1280. The equipment enclosures 1280 are installed in the interior of the container to form a row along the length of the container 1210. The enclosures 1280 are positioned to allow cooled gas to pass through the enclosures from a first region 1240 to cool installed electronic equipment and allow electronic equipment to expel heated gas to a second region 1225. The first region 1240 and second region 1225 are separated by a barrier 1250 that contains cool air and hot air.

An exhaust opening 1222 in the container 1210 in the second region 1225 allows heated gas to vent to the atmosphere. Attached to the container 1210 is a cooling module 1230 configured to draw gas from the atmosphere, cool the gas, and supply the cool gas to the first region. If the environment is not cool enough, supplemental cooling may be supplied to the intake air via a water to air exchanger preferably sourced from a well or pond. In some of these alternate embodiments, the cooling module may include an entry interface 1235a configured to receive cold or chilled water from the external source that may be used to cool the gas. After the chilled water cools the air in the cooling module 1230, it can be expelled through the exit interface 1235b. Embodiments may further include a replaceable particulate/chemical filter, and an optional water to air heat exchanger and pump to be plumbed to a cooling source mentioned above.

As shown in FIG. 12, the exhaust opening 1222 may further include an exhaust module 1220 attached to the exhaust opening 1222. The exhaust module 1220 may include a fan (not shown in FIG. 12) to draw heated gas out from the second region 1225. In embodiments of the data center enclosure, the exhaust module may include a screen to prevent debris and animals from entering the container. The exhaust module provides a rain proof, splash proof, insect proof and rodent proof hood over the exhaust opening 1222. While the fans, filters, exchangers are in the exhaust module shown outside of the main enclosure, they could reside inside the main enclosure to shrink the exterior protrusions to nearly nothing at all. Alternatively, the filters could be replaced with an air-air heat exchanger.

In some embodiments, the data center may include a control system configured to monitor an air temperature, such as the ambient air temperature, the air temperature of either the first region or second region, in order to control fan operation speed and to control the cooling module operation. The data center enclosure may further include a DC power source configured to provide power to the fan and control system. The DC power source is one of a solar power inverter system, a wind turbine, or a battery.

From the foregoing, it will be appreciated that the aspects and embodiments provided by the systems and methods described herein afford an effective way to provide scalable data center IT, power and cooling solutions.

Any references to front and back, left and right, top and bottom, or upper and lower and the like are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements to single or plural configurations.

Any embodiment disclosed herein may be combined with any other embodiment, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. Such terms as used herein are not necessarily all referring to the same embodiment. Any embodiment may be combined with any other embodiment in any manner consistent with the aspects and embodiments disclosed herein.

References to "or" may be construed as inclusive so that any terms described using "or" may indicate any of a single, more than one, and all of the described terms.

Where technical features in the drawings, detailed description or any claim are followed by references signs, the reference signs have been included for the sole purpose of increasing the intelligibility of the drawings, detailed description, and claims. Accordingly, neither the reference signs nor their absence have any limiting effect on the scope of any claim elements.

One skilled in the art will realize the systems and methods described herein may be embodied in other specific forms without departing from the spirit or essential characteristics thereof. For example, components shown or described as being directly coupled may also be indirectly coupled through other components.

The foregoing embodiments are therefore to be considered in all respects illustrative rather than limiting of the described systems and methods. Scope of the systems and methods described herein is thus indicated by the appended claims, rather than the foregoing description, and all changes that come within the meaning and range of equivalency of the claims are therefore intended to be embraced therein.

What is claimed is:

1. A cooling container comprising:
   a shipping container housing having a length, a width, and a height, the length greater than the width and the length greater than the height, and at least one lengthwise sidewall opening;
   a chilled water storage tank including a first interface for receiving chilled water, a plurality of straight pipes joined by elbow connections to provide a folded path, a full path length of the chilled water storage tank being greater than the length of the shipping container housing, and a second interface for outputting the chilled water; and
   a central spine arranged lengthwise within the shipping container housing, the central spine including a plurality of interfaces configured to provide refrigeration fluid and electrical connections and to receive at least one of a chiller module and a free cool unit.

2. A cooling container of claim 1 wherein the container is capable of N+1 redundancy operation for data center reliability and availability.

3. A cooling container of claim 1 further comprising a plurality of free cool units.

4. A cooling container of claim 1 further comprising a plurality of chiller modules.

5. A cooling container of claim 1 further comprising integrated hydronics.

6. A cooling container of claim 1 wherein the shipping container housing may be configured to receive variable number of chiller modules and free cool units, the variable number corresponding to particular capacity and efficiency requirements of a data center system.

7. A cooling container of claim 1 further comprising a plurality of chiller modules and a plurality of free cool units, wherein the plurality of chiller modules and the plurality of free cool units are hot swappable.

8. A cooling container of claim 1 wherein the free cool unit comprises a water-to-air heat exchange coil.

9. A cooling container of claim 1 wherein the plurality of interfaces are disposed at predetermined intervals along a length of the central spine.

10. A cooling container of claim 1 wherein the shipping container housing includes a first end and a second end, disposed opposite the first end, and wherein the cooling container housing is coupled to a data center system at the first end and is configured to provide air movement into and out of the data center system.

11. A cooling container of claim 1 further comprising the cooling container having dimensions matching an ISO shipping container footprint.

12. A cooling container of claim 1 wherein the cooling container comprises a top mounted cooling container disposed on top of a data center equipment container.

13. A cooling container of claim 1 wherein the plurality of interfaces are configured to allow for the at least one of a chiller module and a free cool unit to be disconnected without disrupting a refrigeration fluid supply or an electrical supply to a data center load.

14. A cooling container of claim 1 wherein the central spine is positioned over the chilled water storage tank.

15. A cooling container of claim 1 further comprising an integrated pump.

16. A cooling container of claim 15 further comprising a plurality of integrated pumps, wherein the plurality of integrated pumps provide for N+1 or 2N redundancy.

17. A cooling container of claim 15 further comprising a plurality of integrated pumps forming a plumbing circuit, wherein at least one of the plurality of integrated pumps can be isolated from the plumbing circuit.

18. A cooling container of claim 7 further comprising a master control configured to individually control operation of each chiller module of the plurality of chiller modules.

19. A cooling container of claim 18 wherein the plurality of interfaces includes at least one of chilled water headers and electrical connections disposed along the length of the central spine.

20. A cooling container of claim 19 wherein the chilled water headers and the electrical connections are disposed at predetermined intervals and configured to connect the plurality of chiller modules and the plurality of free cool units.

* * * * *